(12) United States Patent
Lu et al.

(10) Patent No.: US 10,510,970 B2
(45) Date of Patent: Dec. 17, 2019

(54) OPPOSITE SUBSTRATE AND MANUFACTURING METHOD THEREOF, ORGANIC LIGHT-EMITTING DISPLAY PANEL AND DISPLAY DEVICE

(71) Applicant: BOE TECHNOLOGY GROUP CO., LTD., Beijing (CN)

(72) Inventors: Jiangnan Lu, Beijing (CN); Shi Shu, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/994,197

(22) Filed: May 31, 2018

(65) Prior Publication Data
US 2019/0115546 A1    Apr. 18, 2019

(30) Foreign Application Priority Data
Oct. 18, 2017    (CN) .......................... 2017 1 0970131

(51) Int. Cl.
| | | |
|---|---|---|
| G06F 3/041 | (2006.01) | |
| G09G 3/20 | (2006.01) | |
| H01L 51/00 | (2006.01) | |
| H01L 51/56 | (2006.01) | |
| H01L 51/52 | (2006.01) | |
| H01L 27/32 | (2006.01) | |

(52) U.S. Cl.
CPC ...... *H01L 51/0096* (2013.01); *H01L 27/3246* (2013.01); *H01L 51/5215* (2013.01); *H01L 51/5228* (2013.01); *H01L 51/56* (2013.01); *H01L 27/322* (2013.01); *H01L 51/5284* (2013.01)

(58) Field of Classification Search
CPC . H01L 51/525; H01L 27/322; H01L 27/3276; G02F 1/1339
See application file for complete search history.

(56) References Cited

U.S. PATENT DOCUMENTS

| | | | | |
|---|---|---|---|---|
| 2010/0097295 | A1* | 4/2010 | Kwak | H01L 27/322 345/32 |
| 2012/0126258 | A1* | 5/2012 | Lee | H01L 27/3276 257/88 |
| 2012/0133612 | A1* | 5/2012 | Wang | G06F 3/0412 345/174 |

(Continued)

*Primary Examiner* — Bradley Smith
*Assistant Examiner* — David J Goodwin
(74) *Attorney, Agent, or Firm* — Collard & Roe, P.C.

(57) ABSTRACT

An opposite substrate, a method for manufacturing the opposite substrate, an organic light-emitting display panel and a display device are provided by the embodiments of the present disclosure. The opposite substrate includes a base substrate, an auxiliary electrode on the base substrate, a planarization layer on a side of the auxiliary electrode facing away from the base substrate, a spacer on a side of the planarization layer facing away from the base substrate, and a conductive layer on a side of the spacer facing away from the base substrate. The conductive layer at least covers a surface of the spacer facing away from the base substrate, and the conductive layer is electrically connected with the auxiliary electrode through a via hole structure passing through the planarization layer.

17 Claims, 6 Drawing Sheets

(56) References Cited

U.S. PATENT DOCUMENTS

| | | | |
|---|---|---|---|
| 2015/0028343 A1* | 1/2015 | Li | H01L 27/124 |
| | | | 257/72 |
| 2015/0331161 A1* | 11/2015 | Wang | H01L 51/52 |
| | | | 359/513 |
| 2016/0291377 A1* | 10/2016 | Kosuge | G02F 1/13439 |
| 2017/0102591 A1* | 4/2017 | Huh | G02F 1/133512 |
| 2019/0067405 A1* | 2/2019 | Wang | H01L 51/525 |

* cited by examiner

OPPOSITE SUBSTRATE AND MANUFACTURING METHOD THEREOF, ORGANIC LIGHT-EMITTING DISPLAY PANEL AND DISPLAY DEVICE

The present application claims the priority of the Chinese Patent Application No. 201710970131.6 filed on Oct. 18, 2017, which is incorporated herein by reference as part of the disclosure of the present application.

TECHNICAL FIELD

Embodiments of the present disclosure relate to an opposite substrate, a method for manufacturing the opposite substrate, an organic light-emitting display panel and a display device.

BACKGROUND

In flat panel displays, organic light-emitting diode (OLED) display panels have many advantages, such as self luminescence, fast response, wide angle of view, high brightness, bright coloring and light weight and so on, and the OLED display panels have attracted extensive attentions.

According to a difference of light-emitting surface, the OLED display panels are divided into top light-emitting type OLED display panels and bottom light-emitting type OLED display panels. At present, the proportion of the OLED display panels in large size products is becoming larger and larger, it is foreseeable that OLED display panels will continue to develop rapidly in the future. In a case that bottom light-emitting technology is applied to large size OLED display products, a problem of low aperture ratio of the OLED display products is occurred, which is unable to meet the requirements of OLED display products for display effect, therefore, top light-emitting technology is required to be developed. In the top light-emitting technology, in order to increase transmittance of light, a cathode of the OLED display panel is required to be made of a thin transparent conductive film, but impedance of the thin transparent conductive film is very large, a large voltage drop is occurred in a case that a current flows through the cathode, which affects the uniformity of the brightness of the OLED display panel.

SUMMARY

At least one embodiment of the present disclosure provides an opposite substrate, a method for manufacturing an opposite substrate, an organic light-emitting display panel and a display device, to solve the problem that the spacer is easily to fall off.

At least one embodiment of the present disclosure provides an opposite substrate, and the opposite substrate comprises: a base substrate, an auxiliary electrode on the base substrate, a planarization layer on a side of the auxiliary electrode facing away from the base substrate, a spacer on a side of the planarization layer facing away from the base substrate, and a conductive layer on a side of the spacer facing away from the base substrate; wherein the conductive layer at least covers a surface of the spacer facing away from the base substrate, and the conductive layer is electrically connected with the auxiliary electrode through a via hole structure passing through the planarization layer.

For example, in the opposite substrate provided by at least one embodiment of the present disclosure, the planarization layer is integrated with the spacer.

For example, in the opposite substrate provided by at least one embodiment of the present disclosure, the planarization layer and the spacer are independently arranged.

For example, the opposite substrate provided by at least one embodiment of the present disclosure further comprises: black matrices located between the base substrate and the auxiliary electrode, wherein orthographic projections of the black matrices on the base substrate cover an orthographic projection of the auxiliary electrode on the base substrate.

For example, in the opposite substrate provided by at least one embodiment of the present disclosure, the conductive layer is electrically connected with the auxiliary electrode through a plurality of the via hole structures passing through the planarization layer.

For example, in the opposite substrate provided by at least one embodiment of the present disclosure, an orthographic projection of the auxiliary electrode on the base substrate covers orthographic projections of the plurality of the via hole structures.

For example, the opposite substrate provided by at least one embodiment of the present disclosure further comprises: a color filter layer disposed between two adjacent black matrices among the black matrices.

At least one embodiment of the present disclosure further provides an organic light-emitting display panel, and the organic light-emitting display panel comprises an array substrate and any one of the opposite substrate described above.

For example, in the organic light-emitting display panel provided by at least one embodiment of the present disclosure, the array substrate comprises a driving backboard and an organic light-emitting element disposed on the driving backboard, the organic light-emitting element comprises a first electrode, a light-emitting layer and a second electrode arranged in sequence on the driving backboard, and the second electrode is electrically connected with the conductive layer of the opposite substrate.

At least one embodiment of the present disclosure further provides a display device, and the display device comprises any one of the organic light-emitting display panel described above.

At least one embodiment of the present disclosure further provides a method for manufacturing an opposite substrate, and the manufacturing method comprises: providing a base substrate; forming an auxiliary electrode on the base substrate; forming a planarization layer and a spacer on the base substrate provided with the auxiliary electrode; forming a conductive layer on the base substrate provided with the planarization layer and the spacer; wherein the conductive layer at least covers a surface of the spacer facing away from the base substrate, and the conductive layer is electrically connected with the auxiliary electrode through a via hole structure passing through the planarization layer.

For example, in the method for manufacturing the opposite substrate provided by at least one embodiment of the present disclosure, the forming the planarization layer and the spacer on the base substrate provided with the auxiliary electrode comprises: forming the planarization layer and the spacer through one patterning process.

For example, in the method for manufacturing the opposite substrate provided by at least one embodiment of the present disclosure, the forming the planarization layer and the spacer on the base substrate provided with the auxiliary electrode comprises: forming the planarization layer covering the base substrate on the base substrate provided with the auxiliary electrode by a first patterning process; and forming the spacer on the base substrate provided with the planarization layer by a second patterning process.

For example, in the method for manufacturing the opposite substrate provided by at least one embodiment of the present disclosure, the via hole structure is formed in a process of forming the planarization layer.

For example, in the method for manufacturing the opposite substrate provided by at least one embodiment of the present disclosure, before forming the auxiliary electrode, the method further comprises: forming black matrices on the base substrate, and orthographic projections of the black matrices on the base substrate cover an orthographic projection of the auxiliary electrode on the base substrate.

For example, in the method for manufacturing the opposite substrate provided by at least one embodiment of the present disclosure, before forming the auxiliary electrode, the method further comprises: forming a color filter layer on the base substrate, wherein the color filter layer disposed between two adjacent black matrices among the black matrices.

For example, in the method for manufacturing the opposite substrate provided by at least one embodiment of the present disclosure, a film for forming the auxiliary electrode and a film for forming the conductive layer are formed by a magnetron sputtering process.

The planarization layer is disposed on the auxiliary electrode, the spacer is disposed on the planarization layer in at least one embodiment of the present disclosure, and an adhesion of the spacers on the planarization layer is larger than an adhesion of the spacers on the auxiliary electrode, in this way, the problem that the spacers are easy to fall off due to a smooth surface of the auxiliary electrode is avoided, so that a good product rate of OLED display products formed subsequently is improved.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the disclosure and thus are not limitative of the disclosure.

FIGS. 8a, 8b, 8d, 8e are schematic diagrams of sectional structures respectively after each step in the method for manufacturing the opposite substrate provided by at least one embodiment of the present disclosure.

REFERENCE NUMERALS

100—opposite substrate; 101,01—base substrate; 102—electrode; 103—planarization layer; 104—auxiliary electrode; 105, 04—spacers; 02—auxiliary electrode; 03—planarization layer; 05—conductive layer; 06—via hole structure; 07—black matrix; 08—color filter layer; 09—driving substrate; 10—buffer layer; 11—active layer; 12—gate insulating layer; 13—gate electrode; 14—interlayer insulation layer; 15—source electrode; 16—drain electrode; 17—planarization layer; 18—pixel definition layer; 19—first electrode; 20—light-emitting layer; 21—second electrode.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Figure 1:
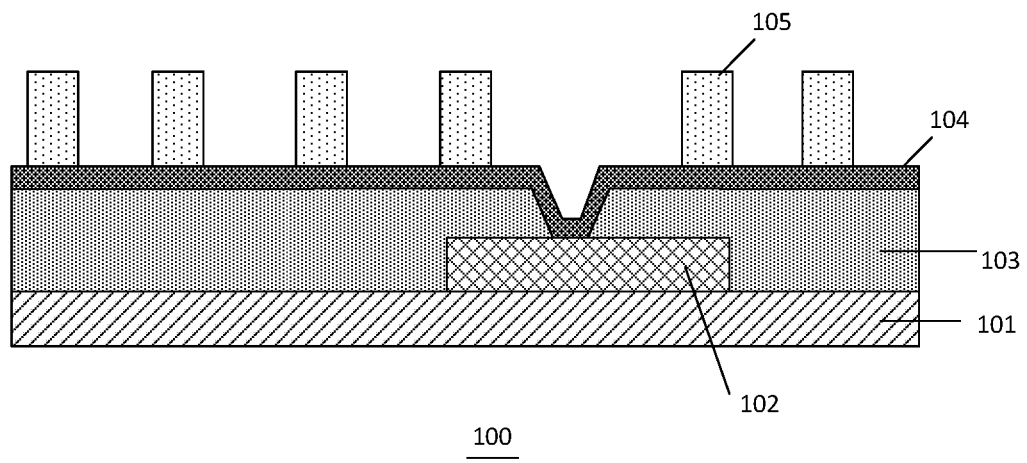
FIG. 1 is a schematic diagram of a sectional structure of an opposite substrate.

For example, FIG. 1 is a schematic diagram of a sectional structure of an opposite substrate. As illustrated in FIG. 1, an opposite substrate 100 comprises a base substrate 101; an electrode 102 is disposed on the base substrate 101; a planarization layer 103 is disposed on the electrode 102; in order to reduce a resistance of the electrode 102, an auxiliary electrode 104 connected in parallel with the electrode 102 is disposed on the planarization layer 103, and a resistivity of a material for forming the auxiliary electrode 104 is less than a resistivity of a material for forming the electrode 102; and spacers 105 are formed on the auxiliary electrode 104 to avoid a problem of damaging to surfaces of the opposite substrate 100 and an array substrate (not illustrated in FIG.

1) in a case that the opposite substrate 100 is bonded and directly contacted with the array substrate.

However, in the process of manufacturing the opposite substrate, because the material of the auxiliary electrode 104 is a conductive metal, and an adhesion of the spacers 105 on the conductive metal is poor, in this way, there is a problem that the spacers 105 are easy to fall off from the conductive metal, which affects a good product rate of the finally-formed OLED display products.

Figure 2:
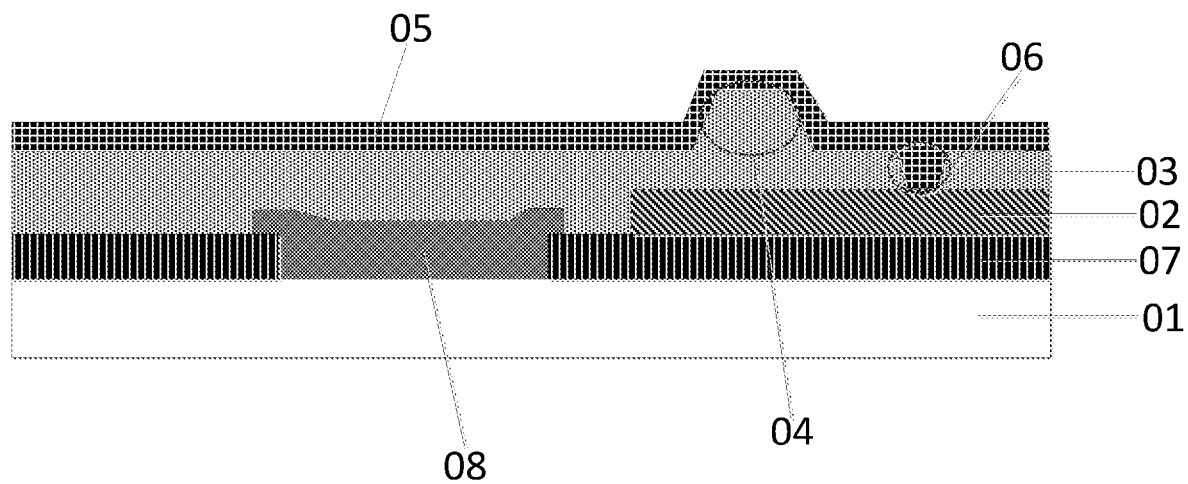
FIG. 2 is a schematic diagram of a sectional structure of an opposite substrate provided by at least one embodiment of the present disclosure.

At least one embodiment of the present disclosure provides an opposite substrate, for example, FIG. 2 is a schematic diagram of a sectional structure of the opposite substrate provided by at least one embodiment of the present disclosure. As illustrated in FIG. 2, the opposite substrate 100 comprises: a base substrate 01, an auxiliary electrode 02 disposed on the base substrate 01, a planarization layer 03 on a side of the auxiliary electrode 02 facing away from the base substrate 01, a spacer 04 on a side of the planarization layer 03 facing away from the base substrate 01, and a conductive layer 05 on a side of the spacer 04 facing away from the base substrate 01; the conductive layer 05 at least covers a surface of the spacer 04 facing away from the base substrate 01, and the conductive layer 05 is electrically connected with the auxiliary electrode 02 through a via hole structure 06 passing through the planarization layer 03.

In at least one embodiment of the present disclosure, the planarization layer 03 is disposed on the auxiliary electrode 02, and the spacer 04 is disposed on the planarization layer 03; because an adhesion of the spacers 04 on the planarization layer 03 is larger than an adhesion of the spacers 04 on the auxiliary electrode 02, in this way, the problem that the spacers are easy to fall off due to the smooth surface of the auxiliary electrode 104 in FIG. 1 is avoided, so that the good product rate of the finally-formed OLED display products is improved.

For example, in the opposite substrate provided by at least one embodiment of the present disclosure, as illustrated in FIG. 2, the conductive layer 05 covers an entirety of the base substrate 01, in this case, in order not to affect a transmittance of light, the conductive layer 05 covering the entirety of the base substrate 01 is a transparent conductive layer. For example, the conductive layer 05 partially covers the base substrate 01. In a case that the conductive layer 05 partially covers the base substrate 01, the material of the conductive layer 05 is a transparent conductive material or a thin metal material, which is not limited herein.

As illustrated in FIG. 2, a number of the via hole structure 06 is set in accordance with a number of the auxiliary electrode 02. For example, one auxiliary electrode 02 corresponds to one via hole structure 06, so that the auxiliary electrode 02 is electrically connected with the conductive layer 05 through the corresponding via hole structure 06.

It is to be noted that, the opposite substrate provided by at least one embodiment of the present disclosure for example is mainly used in large size OLED display panels, and the auxiliary electrode 02 is mainly connected in parallel with a cathode of the OLED display panel to reduce an impedance of the cathode, in this way, the uniformity of the brightness of the OLED display panel is improved.

For example, in the opposite substrate provided by at least one embodiment of the present disclosure, as illustrated in FIG. 2, the planarization layer 03 is integrated with the spacer 04. It is to be noted that, the planarization layer 03 integrated with the spacer 04 means that a material of the planarization layer 03 is the same as a material of the spacer 04 and the planarization layer 03 and the spacer 04 are formed in a same process, that is, the planarization layer 03 is connected with the spacer 04 without an contact interface therebetween, which is equivalent to increasing a contact area between the spacer 04 and the base substrate 01, and the adhesive of the spacer 04 on the base substrate 01 is enhanced, which further avoids the problem that the spacer 04 falls off from the base substrate 01.

In addition, the planarization layer 03 and the spacer 04 are formed by a single patterning process, in this way, the spacer 04 is formed during the patterning process of the planarization layer 03, which simplifies the preparation process and saves the cost of production.

Figure 3:
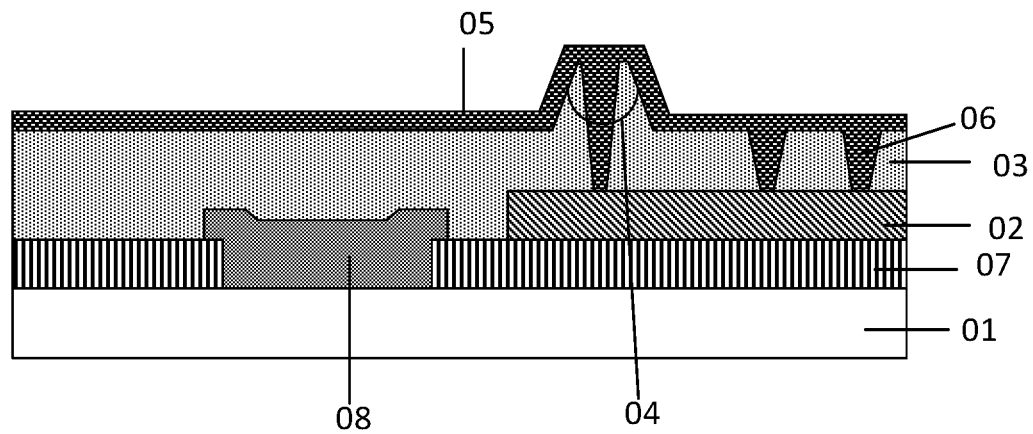
FIG. 3 is another schematic diagram of the sectional structure of the opposite substrate provided by at least one embodiment of the present disclosure.

For example, FIG. 3 is another schematic diagram of the sectional structure of the opposite substrate provided by at least one embodiment of the present disclosure. The structure in FIG. 3 and the structure in FIG. 2 are basically the same. The difference is only that one auxiliary electrode corresponds to a plurality of via hole structures 06 in FIG. 3. As illustrated in FIG. 3, the number of the via hole structure 06 is 3; but the number of the via hole structure 06 is not limited to this, and it can also be 2, 4, 5, etc.

For example, the conductive layer 05 is electrically connected with the auxiliary electrode 02 by the plurality of via hole structures 06 respectively, so that the conductive layer 05 is connected in parallel with the auxiliary electrode 02 at a plurality of positions. In addition, a thickness of the conductive layer 05 is increased by parallel connection between the conductive layer 05 and the auxiliary electrode 02 through the plurality of via hole structures 06, which is equivalent to increasing a cross section area of the conductive layer 05, thus the resistance of the conductive layer 05 is further reduced.

For example, as illustrated in FIG. 3, an orthographic projection of the auxiliary electrode 02 on the base substrate 01 covers orthographic projections of the plurality of the via hole structures 06 on the base substrate 01.

For example, as illustrated in FIG. 3, the auxiliary electrode 02 is arranged at the position corresponds to the spacer 04, in this way, as illustrated in FIG. 3, at least one via hole structure 06 is arranged corresponding to the spacer 04, that is, the at least one via hole structure 06 penetrates the spacer 04 and the planarization layer 03 simultaneously.

Figure 4A:
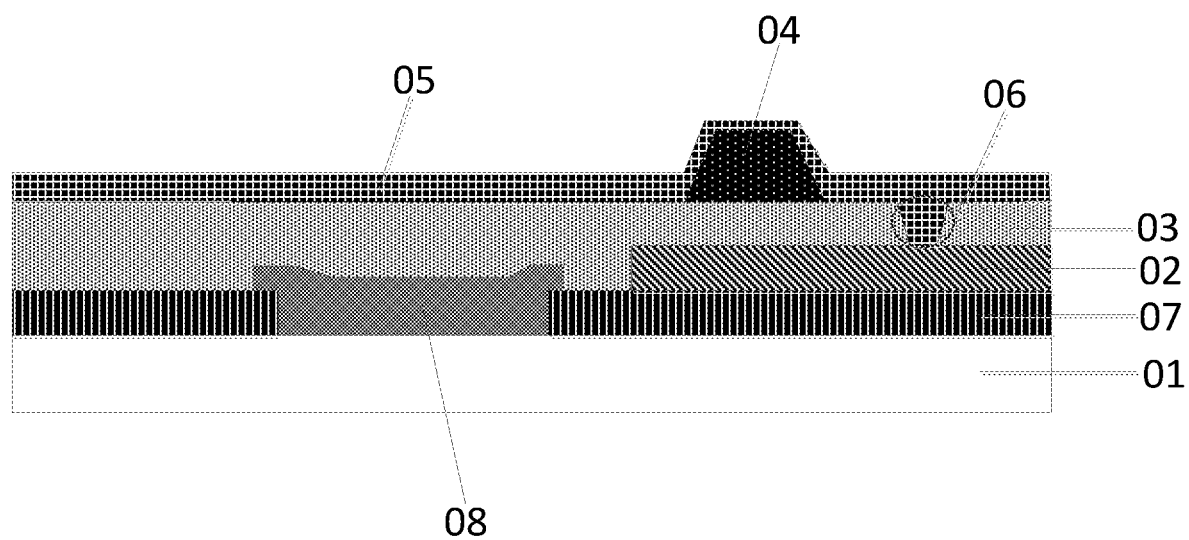
FIG. 4a is still another schematic diagram of the sectional structure of the opposite substrate provided by at least one embodiment of the present disclosure.

For example, FIG. 4a is still another schematic diagram of the sectional structure of the opposite substrate provided by at least one embodiment of the present disclosure. As illustrated in FIG. 4a, the planarization layer 03 and the spacer 04 are independently arranged, that is, the planarization layer 03 covering the base substrate 01 is formed on the base substrate 01 firstly, and then the spacer 04 is formed on the base substrate 01 formed with the planarization layer 03. Because the adhesion of the spacer 04 on the planarization layer 03 is larger than the adhesion of the spacer 04 on the auxiliary electrode 02, so that the problem that the spacer is easy to fall off from the base substrate 01 is avoided.

Figure 4B:
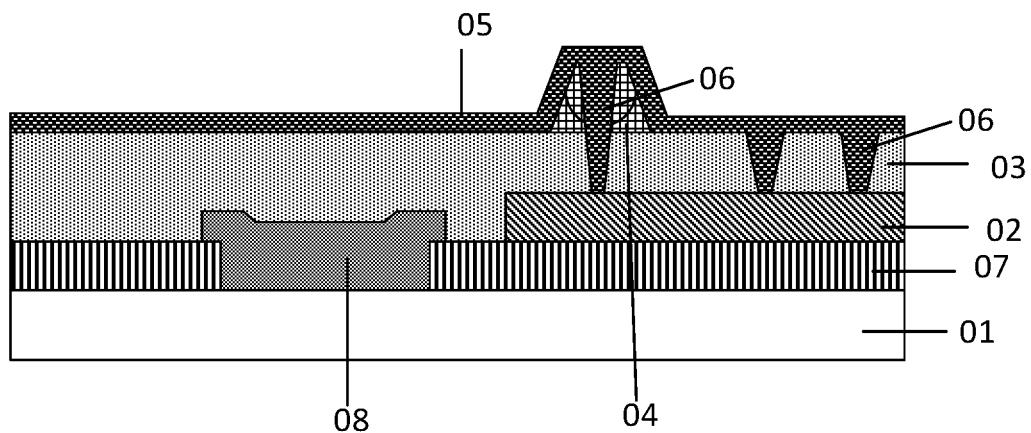
FIG. 4b is still another schematic diagram of the sectional structure of the opposite substrate provided by at least one embodiment of the present disclosure.

For example, FIG. 4b is still another schematic diagram of the sectional structure of the opposite substrate provided by at least one embodiment of the present disclosure. The structure in FIG. 4b and the structure in FIG. 4a are basically the same. The difference is only that one auxiliary electrode corresponds to a plurality of via hole structures 06, and at least one via hole structure 06 penetrates the spacer 04 and the planarization layer 03 which are independently arranged at the same time in FIG. 4b. As illustrated in FIG. 4b, the conductive layer 05 is electrically connected with the auxiliary electrode 02 through the plurality of the via hole structures 06 passing through the planarization layer 03, that is, each auxiliary electrode 02 corresponds to the plurality of via hole structures 06. The orthographic projection of the auxiliary electrode 02 on the base substrate 01 covers the orthographic projections of the plurality of the via hole structures 06 on the base substrate 01, and the auxiliary electrode 02 is arranged at the position corresponding to the spacer 04. In this way, at least one via hole structure 06 is arranged corresponding to the spacer 04, that is, the at least one via hole structure 06 penetrates the spacer 04 and the planarization layer 03 which are independently arranged at the same time.

For example, in the opposite substrate provided by at least one embodiment of the present disclosure, as illustrated in FIG. 2, FIG. 3, FIG. 4a and FIG. 4b, the opposite substrate further comprises black matrices 07 located between the base substrate 01 and the auxiliary electrode 02, and orthographic projections of the black matrices 07 on the base substrate 01 cover the orthographic projection of the auxiliary electrode 02 on the base substrate 01.

During testing the opposite substrate, electrostatic charges are existed in the black matrix 07. In at least one embodiment of the present disclosure, the auxiliary electrode 02 is directly arranged on the black matrix 07 to release the electrostatic charges in the black matrix 07, so that the display effect of the display product is not affected. In order not to influence the aperture ratio of the display product, in the process of manufacturing the auxiliary electrode 02, the orthographic projection of the auxiliary electrode 02 on the base substrate 01 is in the orthographic projections of the black matrices 07 on the base substrate 01.

As illustrated in FIG. 2, FIG. 3, FIG. 4a and FIG. 4b, the opposite substrate further comprises a color filter layer 08, and the color filter layer 08 is disposed between two adjacent black matrices 07 among the black matrices 07.

For example, the auxiliary electrode 02 is made of a transparent conductive material, and the transparent conductive material includes indium tin oxide (ITO), indium zinc oxide (IZO), indium gallium oxide (IGO), zinc gallium oxide (GZO)), Indium oxide ($In_2O_3$), aluminum zinc oxide (AZO) and carbon nanotubes.

For example, the auxiliary electrode 02 is made of a metal conductive material, and the metal conductive material includes a single metal such as such as copper (Cu), chromium (Cr), molybdenum (Mo), gold (Au), silver (Ag) and platinum (Pt), or an alloy formed of the above metals, for example, a copper chromium alloy (CuCr) or a chromium molybdenum alloy (CrMo).

For example, the auxiliary electrode 02 is a laminated structure formed by any combination of the transparent conductive material and the metal conductive material as described above.

For example, a thickness of the auxiliary electrode 02 is from 0.5 μm to 1 μm, such as 0.5 μm, 0.6 μm, 0.7 μm, 0.8 μm, 0.9 μm, or 1 μm, etc.

For example, a thickness of the planarization layer 03 is from 1 μm to 3 μm, and a thickness of the conductive layer 05 is from 2 μm to 5.7 μm.

For example, the opposite substrate includes a display region and a peripheral region outside the display region. The display region is also referred to as an AA (Active Area), and the display region is used for displaying. The peripheral region is used for arranging a driving circuit, packaging a display panel, and the like. For example, in the peripheral region, the conductive layer 05 is electrically connected with the auxiliary electrode 02, and in the display region, the conductive layer 05 is electrically connected with the auxiliary electrode again 02, in this way, the conductive layer 05 and the auxiliary electrode 02 are connected at both ends respectively to form a parallel circuit. Alternatively, both ends that the conductive layer 05 and the auxiliary electrode 02 connected to each other are located in the display region. In a case that the conductive layer 05 receives a voltage signal and transmits the voltage signal, and the voltage signal reaches the auxiliary electrode 02 that electrically connected to the conductive layer 05, the auxiliary electrode 02 transmits the voltage signal simultaneously with the conductive layer 05 as a branch of the conductive layer 05, which is equivalent to the conductive layer 05 and the auxiliary electrode 02 forming the parallel circuit, in this way, the resistance in the process of electrical signal transmission is reduced. For example, the auxiliary electrode 02 receives the voltage signal firstly, in a case that the voltage signal reaches the conductive layer 05 electrically connected to the auxiliary electrode 02, the conductive layer 05 as a branch for transmitting the voltage signal simultaneously with the auxiliary electrode 02. For example, the conductive layer 05 and the auxiliary electrode 02 receive the voltage signal simultaneously, the conductive layer 05 and the auxiliary electrode 02 transmit the voltage signal simultaneously as two branches.

The conductive layer 05 and the auxiliary electrode 02 are electrically connected in parallel in the embodiments of the present disclosure, which equivalents to increasing the equivalent thickness of the conductive layer 05, thus the resistance of the conductive layer 05 is reduced and the problem of the large voltage drop due to the large resistance of the conductive layer 05 in a case that the conductive layer 05 is made of a thin metal is avoided, and further the problem of damaging to organic light-emitting display panel due to the large voltage drop is avoided.

For example, in a case of bonding the opposite substrate and an array substrate in the following steps, the conductive layer 05 of the opposite substrate is connected in parallel with a second electrode of the array substrate, so that the resistance of the second electrode is reduced by the parallel connection of three layers of conductive material, and further the problem of damaging to organic light-emitting display panel due to the large voltage drop is avoided.

Figure 5:
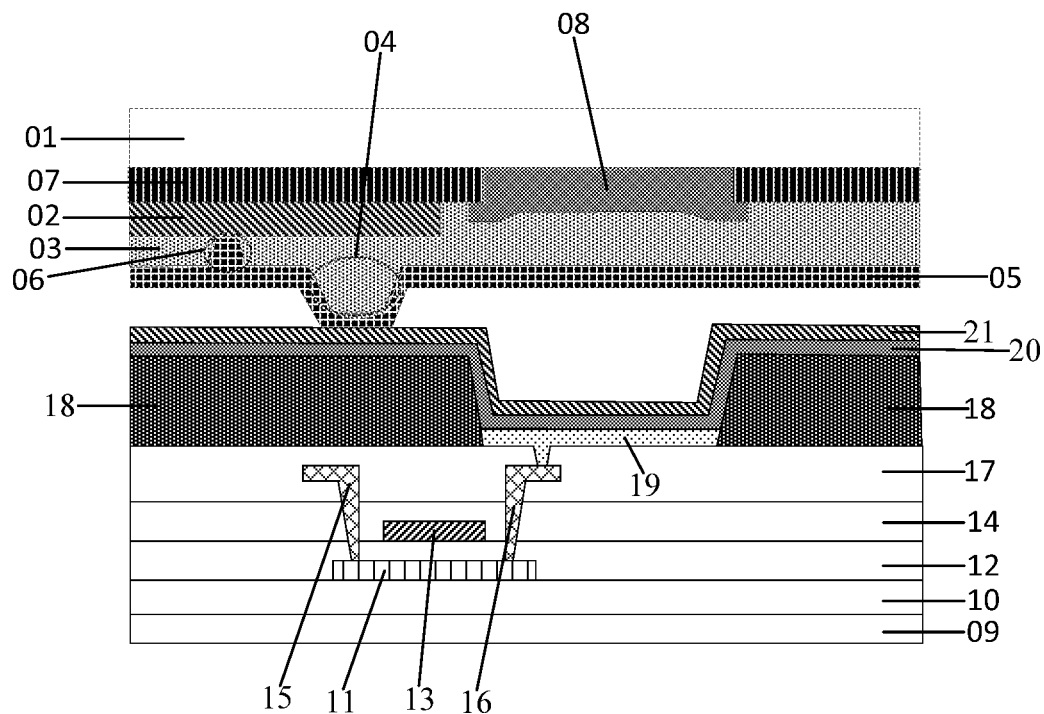
FIG. 5 is a schematic diagram of a sectional structure of an organic light-emitting display panel provided by at least one embodiment of the present disclosure.

At least one embodiment of the present disclosure further provides an organic light-emitting display panel, for example, FIG. 5 is a schematic diagram of a sectional structure of the organic light-emitting display panel provided by at least one embodiment of the present disclosure. As illustrated in FIG. 5, the organic light-emitting display panel comprises an array substrate and an opposite substrate, and the opposite substrate is any one of the opposite substrate described above.

For example, the array substrate comprises a driving backboard and an organic light-emitting element disposed on the driving backboard, the organic light-emitting element comprises a first electrode, a light-emitting layer and the second electrode arranged in sequence on the driving backboard, and the second electrode is electrically connected with the conductive layer 05 of the opposite substrate. For example, the conductive layer 05 of the opposite substrate is connected with the second electrode 21 of the array substrate by directly contacting.

For example, as illustrated in FIG. 5, the driving backboard includes a driving substrate 09, a buffer layer 10 on the driving substrate 09, an active layer 11 on the buffer layer 10, a gate insulating layer 12 on the active layer 11, a gate electrode 13 on the gate insulating layer 12, an interlayer insulating layer 14 on the gate electrode 13, and a source electrode 15 and a drain electrode 16 on the interlayer insulation layer 14, a planarization layer 17 on the source electrode 15 and the drain electrode 16, a pixel definition layer 18 on the planarization layer 17, and the organic light-emitting element includes the first electrode 19, the light-emitting layer 20 and the second electrode 21, the first electrode 19 and the drain electrode 16 are electrically connected, and the second electrode 21 is electrically connected with the conductive layer 05 of the opposite substrate provided by any one of the embodiments of the present disclosure.

For example, the first electrode 19 is an anode of the organic light-emitting element, and the second electrode 21 is the cathode of the organic light-emitting element.

For example, the material of the cathode is a single metal such as silver, magnesium, aluminum and lithium; or the material of the cathode is an alloy such as a magnesium aluminum alloy (MgAl) or a lithium aluminum alloy (LiAl), etc.

For example, the material of the anode is a transparent conductive material, such as indium tin oxide (ITO), indium zinc oxide (IZO) or Zinc Oxide (Zn2O3), etc.

For example, the anode is a stacked structure formed by any combination of the transparent conductive material and the metal conductive material. For example, the anode is a structure that the metal conductive material is sandwiched between two transparent conductive materials, such as ITO-Ag-ITO, ITO-Mo—IZO, ITO-Cr—In2O3, ITO-Cu—ZnO and ITO-Pt-IGO; or the anode is a stacked double-layer structure made of the thin metal conductive material and the transparent conductive material, such as IZO—Mo, ITO-Cr, ZnO—Mg and ITO-Au.

It should be noted that, the materials and the structures of the anode and the cathode as described above are merely examples in the embodiments of the present disclosure, the anode and the cathode may also be made of other materials; according to the difference of the materials of the anode and the cathode, the organic light-emitting display panel is divided into a single-side light-emitting display panel and a double-side light-emitting display panel. In a case that the material of one of the anode and the cathode is opaque or semitransparent material, the organic light-emitting display panel is the single-side light-emitting display panel. In a case that the material of both the anode electrode and the cathode electrode is light-transmitting material and/or semitransparent material, the organic light-emitting display panel is double-side light-emitting display panel.

For example, as illustrated in FIG. 5, the pixel definition layer 18 on the array substrate corresponds to the black matrix 07 on the opposite substrate, and the spacer 04 is arranged on the top of the pixel definition layer 18.

For example, the organic light-emitting element further comprises: a hole transport layer and an electron transport layer, in order to improve the efficiency of injecting the electrons and holes into the light-emitting layer; the organic light-emitting element for example further includes an electron injection layer disposed between the cathode and the electron transport layer and a hole injection layer disposed between the anode and the hole transport layer and other organic functional layer.

For example, in a case of bonding the opposite substrate and the array substrate, the conductive layer 05 of the opposite substrate is connected in parallel with the second electrode 21 of the array substrate, so that the resistance of the second electrode 21 is reduced by the parallel connection of three layers of conductive material, and further the problem of damaging to organic light-emitting display panel due to the large voltage drop is avoided.

The organic light-emitting display panel is formed after the array substrate being bonded with the opposite substrate provided by any one of the above-mentioned embodiments. A principle of the organic light-emitting display panel to solve the problem is similar to a principle of the opposite substrate to solve the problem. Therefore, the embodiments of the organic light-emitting display panel can refer to the embodiments of the above mentioned opposite substrate, which is omitted herein.

At least one embodiment of the present disclosure further provides a display device, and the display device includes any one of the organic light-emitting display panels described above. The display device for example is: a mobile phone, a tablet computer, a television, a display, a notebook computer, a digital picture frame, a navigation system and any other product or component having a display function. Other essential components of the display device which should be understood by those skilled in the art are included, which is omitted herein and should not be a restriction to the present disclosure. The implementation of the display device refers to the embodiments of the above-mentioned opposite substrate, and detailed descriptions will be omitted herein.

Figure 6:
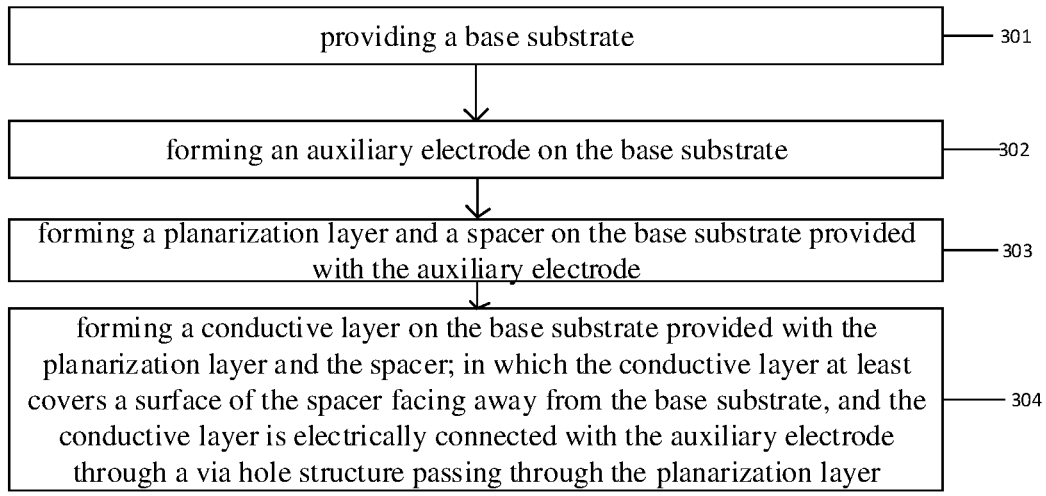
FIG. 6 is a flow diagram of a method for manufacturing an opposite substrate provided by at least one embodiment of the present disclosure.

Based on a same idea, at least one embodiment of the present disclosure further provides a method for manufacturing an opposite substrate. For example, FIG. 6 is a flow diagram of the method for manufacturing the opposite substrate provided by at least one embodiment of the present disclosure. As illustrated in FIG. 6, the manufacturing method includes the following operations:

S301: providing a base substrate;

S302: forming an auxiliary electrode on the base substrate;

S303: forming a planarization layer and a spacer on the base substrate provided with the auxiliary electrode;

S304: forming a conductive layer on the base substrate provided with the planarization layer and the spacer; in which the conductive layer at least covers a surface of the spacer facing away from the base substrate, and the conductive layer is electrically connected with the auxiliary electrode through a via hole structure passing through the planarization layer.

For example, in the manufacturing method illustrated in FIG. 6, the planarization layer is disposed on the auxiliary electrode, and the spacer is disposed on the planarization layer, and the adhesion of the spacer on the planarization layer is larger than the adhesion of the spacer on the auxiliary electrode, and the problem that the spacer is easy to fall off due to the smooth surface of the auxiliary electrode is avoided, so that the good product rate of the finally-formed OLED display products is improved.

Further, in the manufacturing method illustrated in FIG. 6, the planarization layer is integrated with the spacer. It is to be noted that, the planarization layer integrated with the spacer means that the material of the planarization layer is the same as the material of the spacer and the planarization layer and the spacer are formed in a same process, that is, the planarization layer and the spacer are connected with each other without a contacting interface therebetween, which is equivalent to increasing a contact area between the spacer and the base substrate, and the adhesive of the spacer on the base substrate is enhanced, which further avoids the problem that the spacer falls off from the base substrate.

In addition, the planarization layer, the spacer and the via hole structure are formed by a single patterning process, in this way, the spacer and the via hole structure are formed during the planarization layer is formed, which simplifies the preparation process and saves the cost of production.

For example, the planarization layer, the spacer and the via hole structure are formed on the base substrate provided with the auxiliary electrode by a single patterning process, and the single patterning process includes the following steps:

S401: forming a planarization film covering the base substrate on the base substrate provided with the auxiliary electrode;

S402: coating a photoresist film on the planarization film, then patterning the photoresist film by a half tone mask to form a first photoresist pattern;

For example, the photoresist film is a negative photoresist. The photoresist film is exposed under ultraviolet light by using a half tone mask and then is developed to form a first photoresist pattern. For the negative photoresist, a portion of the photoresist irradiated by the ultraviolet light is remained; and for example, the first photoresist pattern includes a photoresist fully-reserved region, a photoresist half-reserved region and a photoresist removal region, the photoresist fully-reserved region, the photoresist half-reserved region and the photoresist removal region respectively correspond to a region for forming the spacer, a region for forming the planarization layer, and a region for forming the via hole structure.

For example, the photoresist film used in step S402 is a positive photoresist. The photoresist film is exposed under ultraviolet light by using a half tone mask and then is developed to form the first photoresist pattern. For the positive photoresist, a portion of the photoresist irradiated by the ultraviolet light is removed; and for example, the first photoresist pattern includes the photoresist fully-reserved region, the photoresist half-reserved region and the photoresist removal region, the photoresist fully-reserved region, the photoresist half-reserved region and the photoresist removal region respectively correspond to a region for forming the spacer, a region for forming the planarization layer, and a region for forming the via hole structure.

S403: etching the planarization film by using the first photoresist pattern formed in S402 as a mask to form the via hole structure in the region corresponding to the photoresist removal region. Then the photoresist in the photoresist half-reserved region is ashed to remove the photoresist in the photoresist half-reserved region and form a second photoresist pattern, then thinning the planarization film provided with the via hole structure by using the second photoresist pattern as a mask to form the planarization layer, and the retained photoresist is stripped to form the spacer in the region corresponding to the photoresist fully-reserved region.

It is to be noted that, in the above S403, the region for forming the spacer corresponds to the photoresist fully-reserved region, the region for forming the planarization layer corresponds to the photoresist half-reserved region. The planarization layer is also formed between the spacer and the base substrate, the portion of the planarization layer overlapped with the spacer belongs to the photoresist fully-reserved region, rather than the photoresist half-reserved region.

For example, a number of the via hole structure is set in accordance with the number of the auxiliary electrode. One auxiliary electrode corresponds to one via hole structure, so that the auxiliary electrode is electrically connected with the conductive layer through the corresponding via hole structure.

For example, there are a plurality of via hole structures, that is, one auxiliary electrode corresponds to the plurality of via hole structures.

For example, the conductive layer is electrically connected with the auxiliary electrode by the plurality of via hole structures respectively, so that the conductive layer is connected in parallel with the auxiliary electrode at a plurality of positions. In addition, the thickness of the conductive layer is increased by parallel connection between the conductive layer and the auxiliary electrode through the plurality of via hole structures, which is equivalent to increasing a cross section area of the conductive layer, thus the resistance of the conductive layer is further reduced.

For example, the orthographic projection of the auxiliary electrode on the base substrate covers orthographic projections of the plurality of the via hole structures.

For example, the auxiliary electrode is arranged at the position corresponds to the spacer, in this case, the via hole structure is arranged corresponding to the spacer, that is, the via hole structure penetrates the spacer and the planarization layer simultaneously.

For example, forming the planarization layer and the spacer on the base substrate provided with the auxiliary electrode in sequence comprises:

S501: forming a planarization film on the base substrate provided with the auxiliary electrode;

S502: coating a first photoresist film on the planarization film, then the first photoresist film is exposed under ultraviolet light by using a first single-tone mask and developed to form a first photoresist pattern; etching the planarization film by using the first photoresist pattern as a mask and then stripping the first photoresist pattern to form the planarization layer and the via hole structure;

For example, the first photoresist film is a negative photoresist film or a positive photoresist film, a region that the photoresist is reserved in the first photoresist pattern corresponds to the region for forming the planarization layer, and a region that the photoresist is removed in the first photoresist pattern corresponds to the region for forming the via hole structure.

S503: forming (for example, coating) a spacer film on the base substrate provided with the planarization layer and the via hole structure;

S504: coating a second photoresist film on the spacer film, then the second photoresist film is exposed under ultraviolet light by using a second single-tone mask and then is developed to form a second photoresist pattern; etching the spacer film by using the second photoresist pattern as a mask and then stripping the second photoresist pattern to form the spacer.

For example, the second photoresist film is a negative photoresist film or a positive photoresist film, a region that the photoresist is reserved in the second photoresist pattern corresponds to the region for forming the spacer, a region that the photoresist is removed in the second photoresist pattern corresponds to the region without forming the spacer.

It needs to be noted that, in a case that the planarization layer and the spacer are formed in sequence and the via hole structure is formed in the spacer and the planarization layer, the via hole structure is formed in S504.

For example, in a case that the planarization layer and the spacer are formed in sequence on the base substrate provided with the auxiliary electrode, the material of the planarization layer and the material of the spacer are the same or different.

For example, in a case that the planarization layer and the spacer are formed in sequence, one or more via hole structure are formed. The corresponding relationships between the via hole structure and the other structures may refer to the relevant descriptions mentioned above, and detailed descriptions will be omitted herein.

Figure 7:
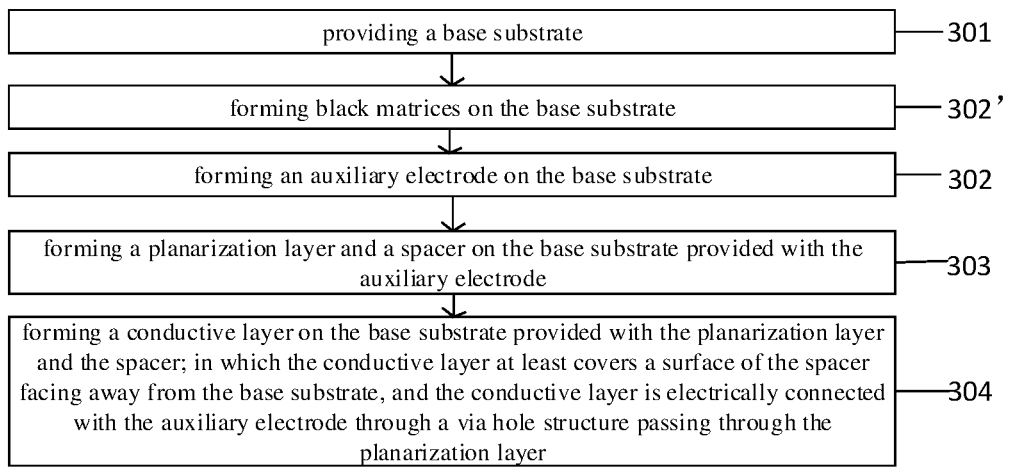
FIG. 7 is another flow diagram of the method for manufacturing the opposite substrate provided by at least one embodiment of the present disclosure.

For example, FIG. 7 is another flow diagram of the method for manufacturing the opposite substrate provided by at least one embodiment of the present disclosure. As illustrated in FIG. 7, the manufacturing method comprises the following operations:

S301: providing a base substrate;

S302': forming black matrices on the base substrate;

S302: forming an auxiliary electrode on the base substrate;

S303: forming a planarization layer and a spacer on the base substrate provided with the auxiliary electrode;

S304: forming a conductive layer on the base substrate provided with the planarization layer and the spacer; in which the conductive layer at least covers a surface of the spacer facing away from the base substrate, and the conductive layer is electrically connected with the auxiliary electrode through a via hole structure passing through the planarization layer.

For example, S301, S302, S303 and S304 can refer to the relevant descriptions of FIG. 6 mentioned above, and detailed descriptions will be omitted herein.

For example, in S302', orthographic projections of the black matrices on the base substrate cover an orthographic projection of the auxiliary electrode on the base substrate. During testing the opposite substrate, electrostatic charges are existed in the black matrices. In the embodiments of the present disclosure, the auxiliary electrode is directly arranged on the black matrices to release the electrostatic charges in the black matrices, so that the display effect of the display product is not affected. In order not to influence the aperture ratio, in the process of manufacturing the auxiliary electrode, the orthographic projection of the auxiliary electrode on the base substrate is in the orthographic projections of the black matrices on the base substrate.

The manufacturing method of the opposite substrate illustrated in FIG. 2 and FIG. 4a will be described in detail by two examples. For example, FIGS. 8a to 8c are schematic diagrams of sectional structures respectively after each steps in first example of the present disclosure has finished; and FIGS. 8a, 8b, 8d, 8e are schematic diagrams of sectional structures respectively after each steps in second example of the present disclosure has finished.

Figure 8A:
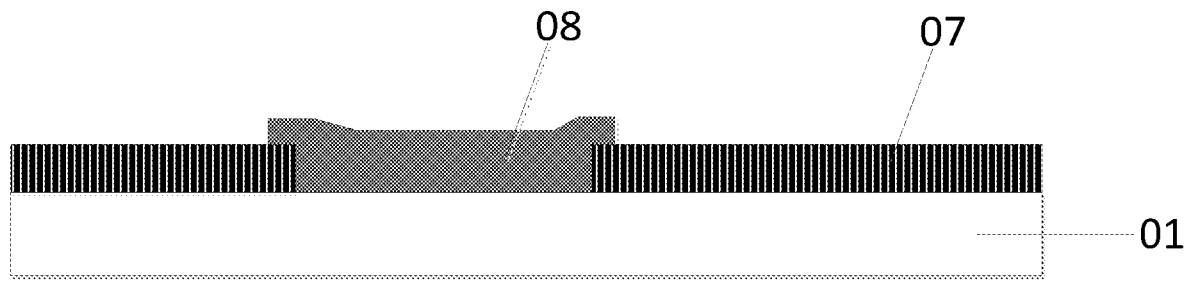
FIGS. 8a to 8c are schematic diagrams of sectional structures respectively after each step in the method for manufacturing the opposite substrate provided by at least one embodiment of the present disclosure.

The first example: for example, the manufacturing method of the opposite substrate illustrated in FIG. 2 includes the following steps:

(1) the black matrices 07 and the color filter layer 08 are formed on the base substrate 01, and the color filter layer 08 is formed between two adjacent black matrices 07, after the step is finished, a section structure is as shown in FIG. 8a.

Figure 8B:
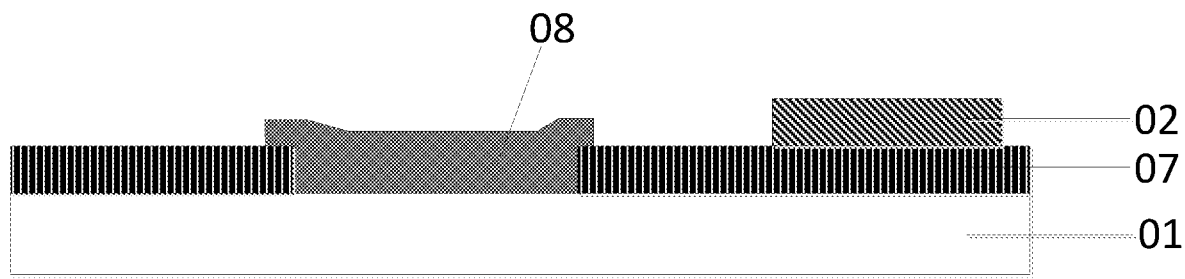
Figure 8C:
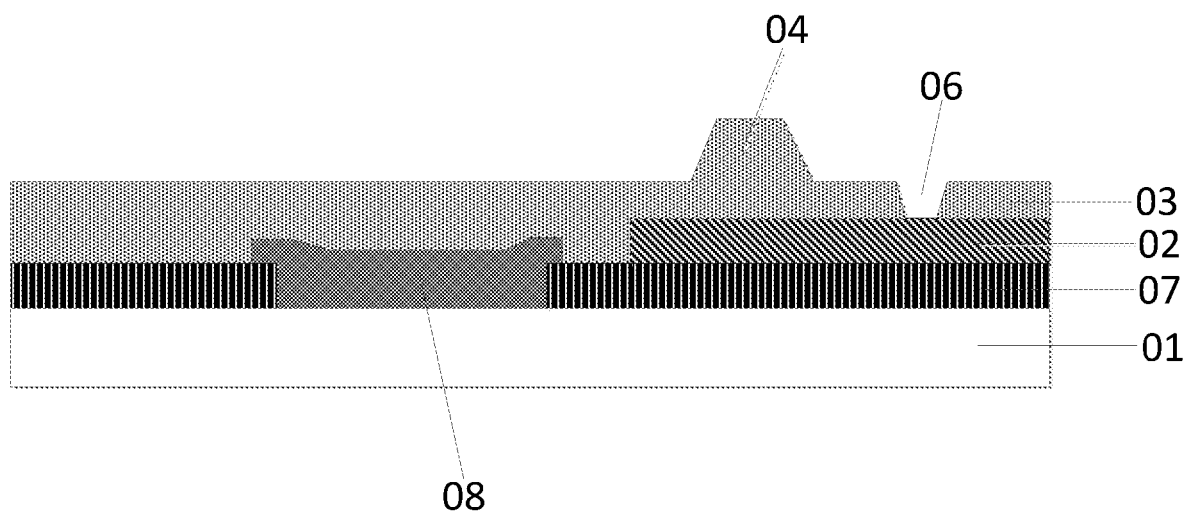

(2) the auxiliary electrode 02 is formed on the base substrate 01 provided with the black matrices 07, in which the orthographic projections of the black matrices 07 on the base substrate 01 cover the orthographic projection of the auxiliary electrode 02 on the base substrate 01, after the step is finished, a section structure is as shown in FIG. 8b.

(3) the planarization layer 03 and the spacer 04 are formed on the base substrate 01 provided with the auxiliary electrode 02 through one patterning process, and the spacer 04 and the via hole structure 06 are formed in a process of forming the planarization layer 03, in this way, the preparation process is simplified and the cost is reduced, after the step is finished, a section structure is as shown in FIG. 8c.

(4) the conductive layer 05 is formed on the base substrate 01 provided with the planarization layer 03, the via hole structures 06 and the spacer 04, in which the conductive layer 05 at least covers the surface of the spacer 04 facing away from the base substrate 01, and the conductive layer 05 is electrically connected with the auxiliary electrode 02 through the via hole structures 06 passing through the planarization layer 03, after the step is finished, a section structure is as shown in FIG. 2.

The opposite substrate shown in FIG. 2 and provided by at least one embodiment of the present disclosure is obtained by the step 1 to step 4 in the first example.

The second example: the manufacturing method of the opposite substrate illustrated in FIG. 4a includes the following operations:

(1') the black matrices 07 and the color filter layer 08 are formed on the base substrate 01, and the color filter layer 08 is formed between two adjacent black matrices 07, after the step is finished, a section structure is as shown in FIG. 8a.

(2') the auxiliary electrode 02 is formed on the base substrate 01 provided with the black matrices 07, and the orthographic projections of the black matrices 07 on the base substrate 01 cover the orthographic projection of the auxiliary electrode 02 on the base substrate 01, after the step is finished, a section structure is as shown in FIG. 8b.

Figure 8D:
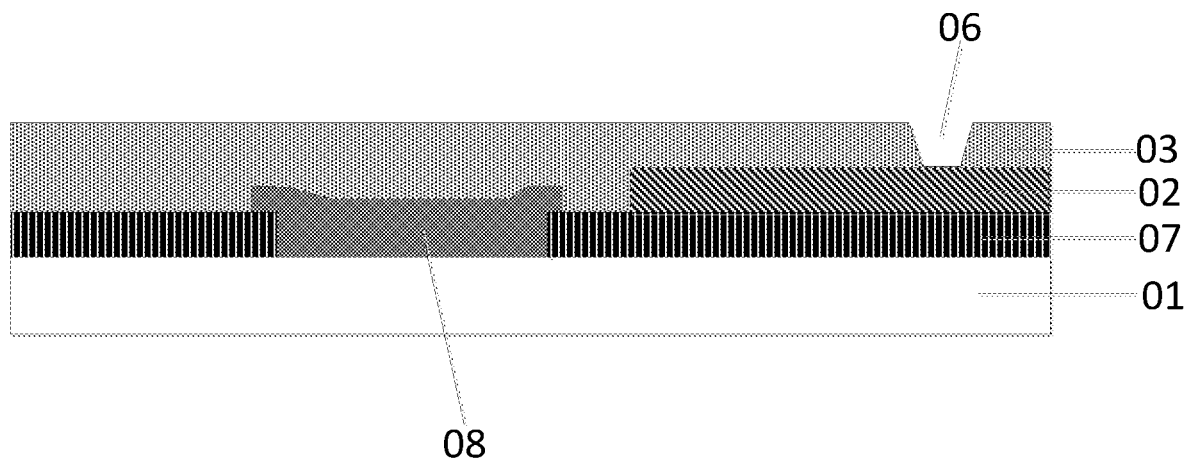

(3') the planarization layer 03 for covering the base substrate 01 is formed on the base substrate 01 provided with the auxiliary electrode 02, the via hole structure 06 penetrating the planarization layer 03 is formed in the process of forming the planarization layer 03, the orthographic projection of the auxiliary electrode 02 on the base substrate 01 covers the orthographic projection of the via hole structure 06 on the base substrate 01, and after the step is finished, a section structure is as shown in FIG. 8d.

Figure 8E:
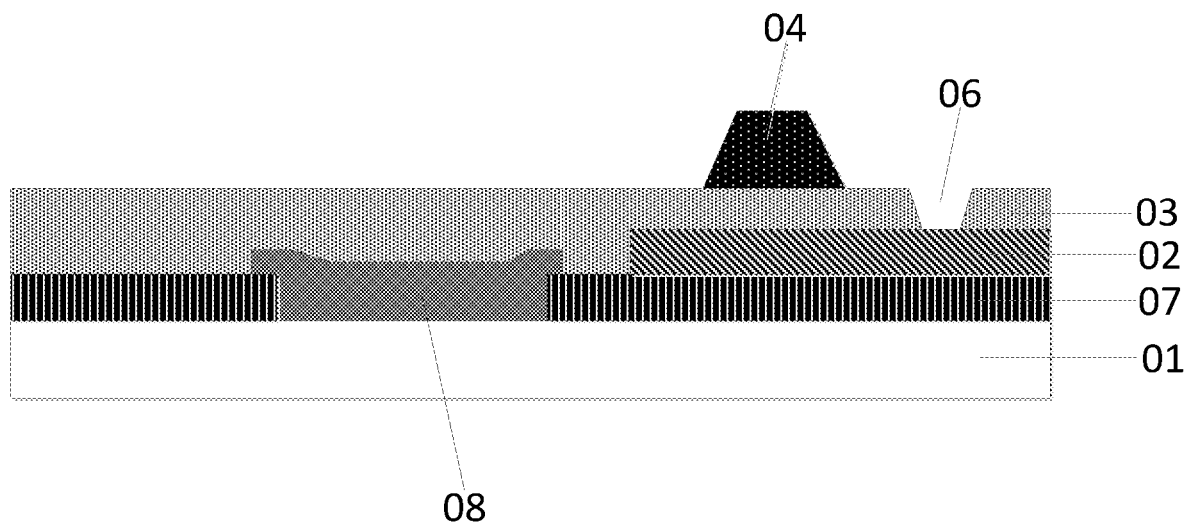

(4') the spacer 04 is formed on the base substrate 01 provided with planarization layer 03, and after the step is finished, a section structure is as shown in FIG. 8e.

(5') the conductive layer 05 is formed on the side of the spacer 04 facing away from the base substrate 01, in which the conductive layer 05 at least covers the surface of the spacer 04 facing away from the base substrate 01, and the conductive layer 05 is electrically connected with the auxiliary electrode 02 through the via hole structures 06 passing through the planarization layer 03, after the step is finished, a section structure is as shown in FIG. 4a.

The opposite substrate shown in FIG. 4a and provided by the embodiment of the present disclosure is obtained by the step 1 to step 5' in the second example.

The opposite substrate, the method for manufacturing the opposite substrate, the organic light-emitting display panel and the display device provided by the embodiments of the present disclosure have at least one of the following beneficial effects:

(1) in the opposite substrate provided by at least one embodiment of the present disclosure, the planarization layer is disposed on the auxiliary electrode, the spacer is disposed on the planarization layer, the adhesion of the spacer on the planarization layer is larger than the adhesion of the spacer on the auxiliary electrode, and the problem that the spacer is easy to fall off due to the smooth surface of the auxiliary electrode is avoided, so that the good product rate of the finally-formed OLED display products is improved.

(2) in the opposite substrate provided by at least one embodiment of the present disclosure, the planarization layer and the spacer are formed by a single patterning process, in this way, the spacer is formed during the process of forming the planarization layer, which simplifies the preparation process and saves the cost of production.

(3) in the opposite substrate provided by at least one embodiment of the present disclosure, the conductive layer and the auxiliary electrode are electrically connected in parallel, which equivalents to increasing the equivalent thickness of the conductive layer, thus reducing the resistance of the conductive layer and avoiding the problem of the large voltage drop due to the large resistance of the conductive layer in a case that the conductive layer is made of the thin metal, and further the problem of damaging to organic light-emitting display panel due to the large voltage drop is avoid.

(4) in the opposite substrate provided by at least one embodiment of the present disclosure, there are a plurality of via hole structures, and the conductive layer is electrically connected with the auxiliary electrode by the plurality of via hole structures respectively, the thickness of the conductive layer is increased by parallel connection between the conductive layer and the auxiliary electrode through the plurality of via hole structures, which is equivalent to increasing the cross section area of the conductive layer, thus the resistance of the conductive layer is further reduced.

Please note that:

(1) the drawings of the embodiments of the present disclosure are only related to the structures mentioned in the embodiments of the present disclosure, and other structures can be obtained by general designs;

(2) for the sake of clarity, sizes of layers or regions in the drawings for describing the embodiments of the present disclosure are not drawn according to an actual scale but are exaggerated or diminished; and (3) the embodiments of the present disclosure and the features therein can be combined with each other in the absence of conflict.

What are described above is related to only the illustrative embodiments of the disclosure and not limitative to the scope of the disclosure. The scopes of the disclosure are defined by the accompanying claims.

What is claimed is:

1. An opposite substrate, comprising: a base substrate, an auxiliary electrode on the base substrate, a planarization layer on a side of the auxiliary electrode facing away from the base substrate, a spacer on a side of the planarization layer facing away from the base substrate, a conductive layer on a side of the spacer facing away from the base substrate, and black matrices located between the base substrate and the auxiliary electrode; wherein the conductive layer at least covers a surface of the spacer facing away from the base substrate, and the conductive layer is electrically connected with the auxiliary electrode through a via hole structure passing through the planarization layer.

2. The opposite substrate according to claim 1, wherein the planarization layer is integrated with the spacer.

3. The opposite substrate according to claim 1, wherein the planarization layer and the spacer are independently arranged.

4. The opposite substrate according to claim 1, wherein orthographic projections of the black matrices on the base substrate cover an orthographic projection of the auxiliary electrode on the base substrate.

5. The opposite substrate according to claim 1, wherein the conductive layer is electrically connected with the auxiliary electrode through a plurality of the via hole structures passing through the planarization layer.

6. The opposite substrate according to claim 5, wherein an orthographic projection of the auxiliary electrode on the base substrate covers orthographic projections of the plurality of the via hole structures.

7. The opposite substrate according to claim 1, further comprising: a color filter layer disposed between two adjacent black matrices among the black matrices.

8. An organic light-emitting display panel, comprising an array substrate and the opposite substrate according claim 1.

9. The organic light-emitting display panel according to claim 8, wherein the array substrate comprises a driving backboard and an organic light-emitting element disposed on the driving backboard, the organic light-emitting element comprises a first electrode, a light-emitting layer and a second electrode arranged in sequence on the driving backboard, and the second electrode is electrically connected with the conductive layer of the opposite substrate.

10. A display device, comprising the organic light-emitting display panel according to claim 8.

11. A method for manufacturing an opposite substrate, comprising:
providing a base substrate;
forming black matrices on the base substrate;
forming an auxiliary electrode on the base substrate;
forming a planarization layer and a spacer on the base substrate provided with the auxiliary electrode;
forming a conductive layer on the base substrate provided with the planarization layer and the spacer;
wherein the conductive layer at least covers a surface of the spacer facing away from the base substrate, and the conductive layer is electrically connected with the auxiliary electrode through a via hole structure passing through the planarization layer;
wherein the black matrices is located between the base substrate and the auxiliary electrode.

12. The method for manufacturing the opposite substrate according to claim 11, wherein the forming the planarization layer and the spacer on the base substrate provided with the auxiliary electrode comprises:
forming the planarization layer and the spacer through one patterning process.

13. The method for manufacturing the opposite substrate according to claim 11, wherein the forming the planarization layer and the spacer on the base substrate provided with the auxiliary electrode comprises:
forming the planarization layer covering the base substrate on the base substrate provided with the auxiliary electrode by a first patterning process; and
forming the spacer on the base substrate provided with the planarization layer by a second patterning process.

14. The method for manufacturing the opposite substrate according to claim 11, wherein the via hole structure is formed in a process of forming the planarization layer.

15. The method for manufacturing the opposite substrate according to claim 11, wherein orthographic projections of the black matrices on the base substrate cover an orthographic projection of the auxiliary electrode on the base substrate.

16. The method for manufacturing the opposite substrate according to claim 15, wherein before forming the auxiliary electrode, the method further comprises: forming a color filter layer on the base substrate, wherein the color filter layer disposed between two adjacent black matrices among the black matrices.

17. The method for manufacturing the opposite substrate according to claim 11, wherein a film for forming the auxiliary electrode and a film for forming the conductive layer are formed by a magnetron sputtering process.

* * * * *